(12) United States Patent
Lin et al.

(10) Patent No.: US 9,872,413 B2
(45) Date of Patent: Jan. 16, 2018

(54) MULTI-FUNCTION HANDLE FOR INFORMATION HANDLING SYSTEM (IHS) CHASSIS

(71) Applicant: Dell Products, L.P., Round Rock, TX (US)

(72) Inventors: Hung-I Lin, Taipei (TW); Hana Schuster Smith, Austin, TX (US); Chun Yang Tseng, Taipei (TW); Richard Andrew Crisp, Austin, TX (US); Timothy Charles Dearborn, Austin, TX (US); Hsiang-Yin Hung, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 77 days.

(21) Appl. No.: 14/921,037

(22) Filed: Oct. 23, 2015

(65) Prior Publication Data

US 2017/0118851 A1    Apr. 27, 2017

(51) Int. Cl.
*H05K 7/14*     (2006.01)
*G11B 33/00*    (2006.01)

(52) U.S. Cl.
CPC .......... *H05K 7/1488* (2013.01); *G11B 33/00* (2013.01); *H05K 7/1461* (2013.01); *H05K 7/1489* (2013.01)

(58) Field of Classification Search
CPC ...... H05K 5/023; H05K 7/183; H05K 7/1461; H05K 7/1489; H05K 7/04; H05K 5/0221; H05K 7/1411; H05K 7/1488; G11B 33/00
USPC .............. 361/679.33–679.39, 756, 724–727
See application file for complete search history.

(56) References Cited

U.S. PATENT DOCUMENTS

| | | | | |
|---|---|---|---|---|
| 5,767,445 A | * | 6/1998 | Wu | G11B 33/124 |
| | | | | 174/542 |
| 6,565,163 B2 | * | 5/2003 | Behl | G11B 25/043 |
| | | | | 312/223.1 |
| 7,724,543 B2 | * | 5/2010 | Ozawa | H04Q 1/02 |
| | | | | 361/729 |
| 8,538,226 B2 | * | 9/2013 | Makrides-Saravanos | G02B 6/4455 |
| | | | | 385/135 |
| 2004/0031767 A1 | * | 2/2004 | Ice | H05K 7/1404 |
| | | | | 211/26 |
| 2005/0025444 A1 | * | 2/2005 | Barnes | A47B 88/08 |
| | | | | 385/135 |
| 2007/0031099 A1 | * | 2/2007 | Herzog | G02B 6/4452 |
| | | | | 385/135 |

(Continued)

*Primary Examiner* — Steven T Sawyer
*Assistant Examiner* — Sagar Shrestha
(74) *Attorney, Agent, or Firm* — Fogarty LLP

(57) ABSTRACT

A multi-function handle for Information Handling System (IHS) chassis is described. In some embodiments, a chassis may include a sled configured to be installed in a rack; a drawer configured to slide in and out of the sled; and a front panel comprising a handle and a selector, the selector configured to allow a user to selectively pull from the rack using the handle: (i) the drawer without the sled, or (ii) the sled and the drawer. A method may include accessing a chassis installed in a rack, the chassis comprising: (i) a drawer configured to slide in and out of a sled; and (ii) a front panel having a handle and a selector; determining that the selector is in a first position; and pulling the handle to slide the drawer without the sled outward from the rack.

13 Claims, 6 Drawing Sheets

(56) References Cited

U.S. PATENT DOCUMENTS

| | | | | |
|---|---|---|---|---|
| 2008/0239648 A1* | 10/2008 | Okamoto | ............... | G06F 1/183 361/725 |
| 2008/0239689 A1* | 10/2008 | Okamoto | ............ | H05K 7/1487 361/807 |
| 2008/0298009 A1* | 12/2008 | Weng | ..................... | G06F 1/187 361/679.37 |
| 2011/0176271 A1* | 7/2011 | Zhang | ..................... | G06F 1/20 361/679.33 |
| 2012/0200978 A1* | 8/2012 | Miller | ..................... | H01Q 1/50 361/118 |
| 2014/0293523 A1* | 10/2014 | Jau | .......................... | H05K 7/14 361/679.4 |
| 2016/0073544 A1* | 3/2016 | Heyd | .................. | G11B 33/128 361/679.31 |
| 2017/0208943 A1* | 7/2017 | Barnes | .................. | A47B 88/49 |

* cited by examiner

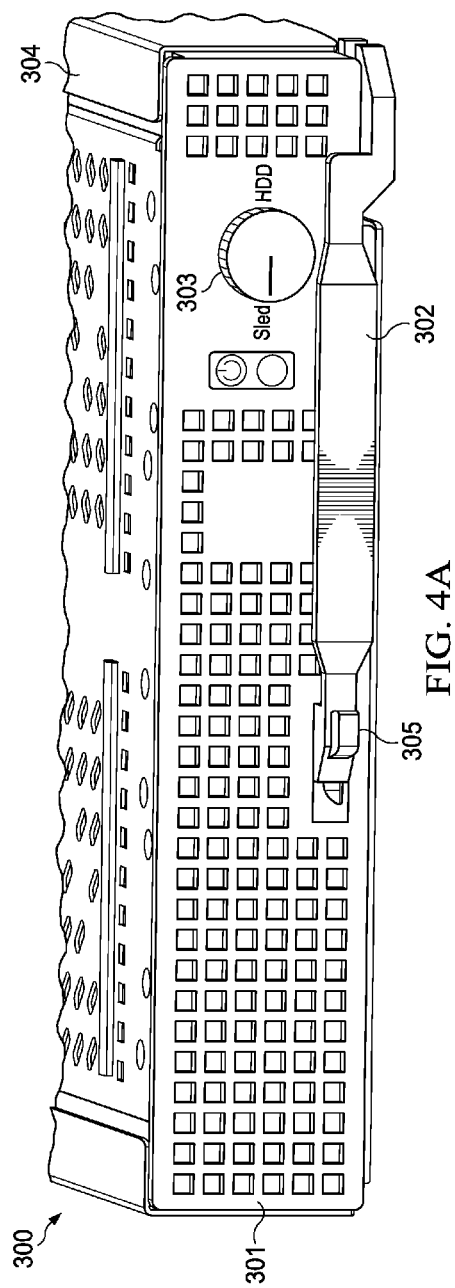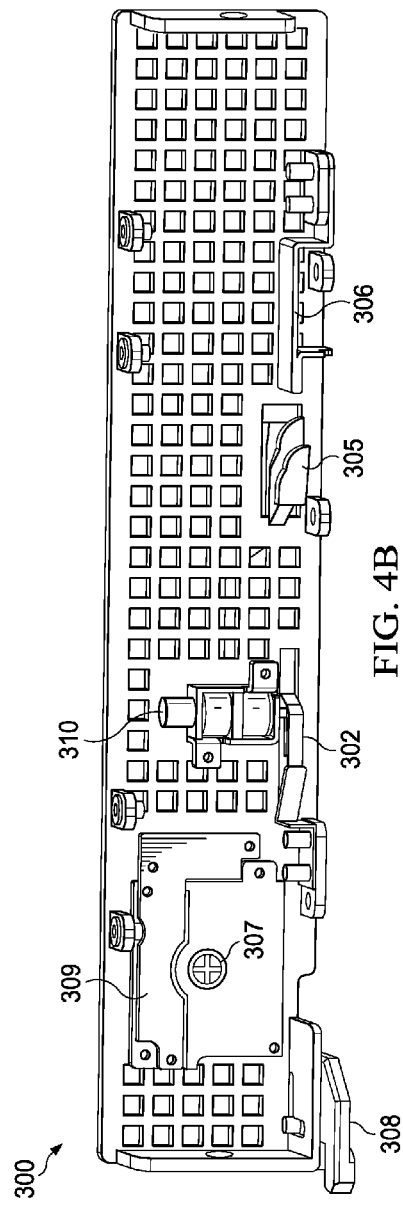
FIG. 4A
FIG. 4B

MULTI-FUNCTION HANDLE FOR INFORMATION HANDLING SYSTEM (IHS) CHASSIS

FIELD

This disclosure relates generally to Information Handling Systems (IHSs), and more specifically, to a multi-function handle for IHS chassis.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

In some cases IHSs may be housed within a chassis or enclosure, and installed in a rack. A rack is a framed structure that is often capable of providing shared power, cooling, networking, and/or management infrastructure to one or more chassis. Examples of IHS components that can be housed within chassis include, but are not limited to, server blades, input/output (I/O) modules, storage devices, and network cards.

SUMMARY

Embodiments of a multi-function handle for Information Handling System (IHS) chassis are described herein. In an illustrative, non-limiting embodiment, a chassis may include: a sled configured to be installed in a rack; a drawer configured to slide in and out of the sled; and a front panel comprising a handle and a selector, the selector configured to allow a user to selectively pull from the rack using the handle: (i) the drawer without the sled, or (ii) the sled and the drawer.

In some implementations, the drawer may include a plurality of Hard Disk Drives (HDDs) bays. Each of the plurality of HDD bays is configured to receive a respective HDD connected to it in a direction perpendicular to the direction in which the drawer slides in and out of the sled.

For example, the selector may be a knob. The knob may be coupled to the handle via a rotating cam. The knob may have a first position corresponding to the pulling of the drawer without the sled, and a second position corresponding to the pulling of the sled and the drawer. The handle may be disposed at a first location alongside the front panel when the knob is in the first position, and the handle may be disposed at a second location alongside the front panel when the knob is in the second position. The second location may be closer to a lateral edge of the front panel than the first location.

When the selector is in the first position, the handle is configured to operate as a fixed handle to allow the drawer to be pulled from the rack without disconnecting an electronic connector between the sled and a backplane of the rack. When the selector is in the second position, the handle is configured to engage with the rack and to operate as a lever to allow the sled and the drawer to be pulled from the rack and to facilitate disconnection of the electronic connector between the sled and the backplane of the rack.

In some cases, the chassis may also include an electronic circuit configured to determine that the sled is powered on; and a lock coupled to the electronic circuit and to the handle, the lock configured to prevent the sled from being removed from the rack in response to the determination despite the knob being in the second position.

In another illustrative, non-limiting embodiment, a system may include a rack and a chassis coupled to the rack, the chassis comprising: a sled; a drawer configured to slide in and out of the sled; and a front panel comprising a handle and a selector, the selector configured to allow a user to selectively remove from the rack, using the handle, either: (i) the drawer, or (ii) the chassis.

In yet another illustrative, non-limiting embodiment, a method may include accessing a chassis installed in a rack, the chassis comprising: (i) a drawer configured to slide in and out of a sled; and (ii) a front panel having a handle and a selector; determining that the selector is in a first position; and pulling the handle to slide the drawer without the sled outward from the rack. The method may also include: determining that the selector is in a second position; pulling the handle; and sliding the entire chassis outward from the rack.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

FIGS. 4A-C are diagrams of an example of a chassis with a multi-function handle in a second configuration according to some embodiments.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail in FIG. 2.

As described above, IHSs may be physically housed within a chassis. A rack is a physical enclosure or frame capable of providing shared power, cooling, networking, and/or management infrastructure to a plurality of chassis, such as server blades, input/output (I/O) modules, storage devices, switches, etc. Examples of storage devices include, but are not limited to, Hard Disk Drives (HDDs), Solid State Drives (SSD), etc.

Figure 1:
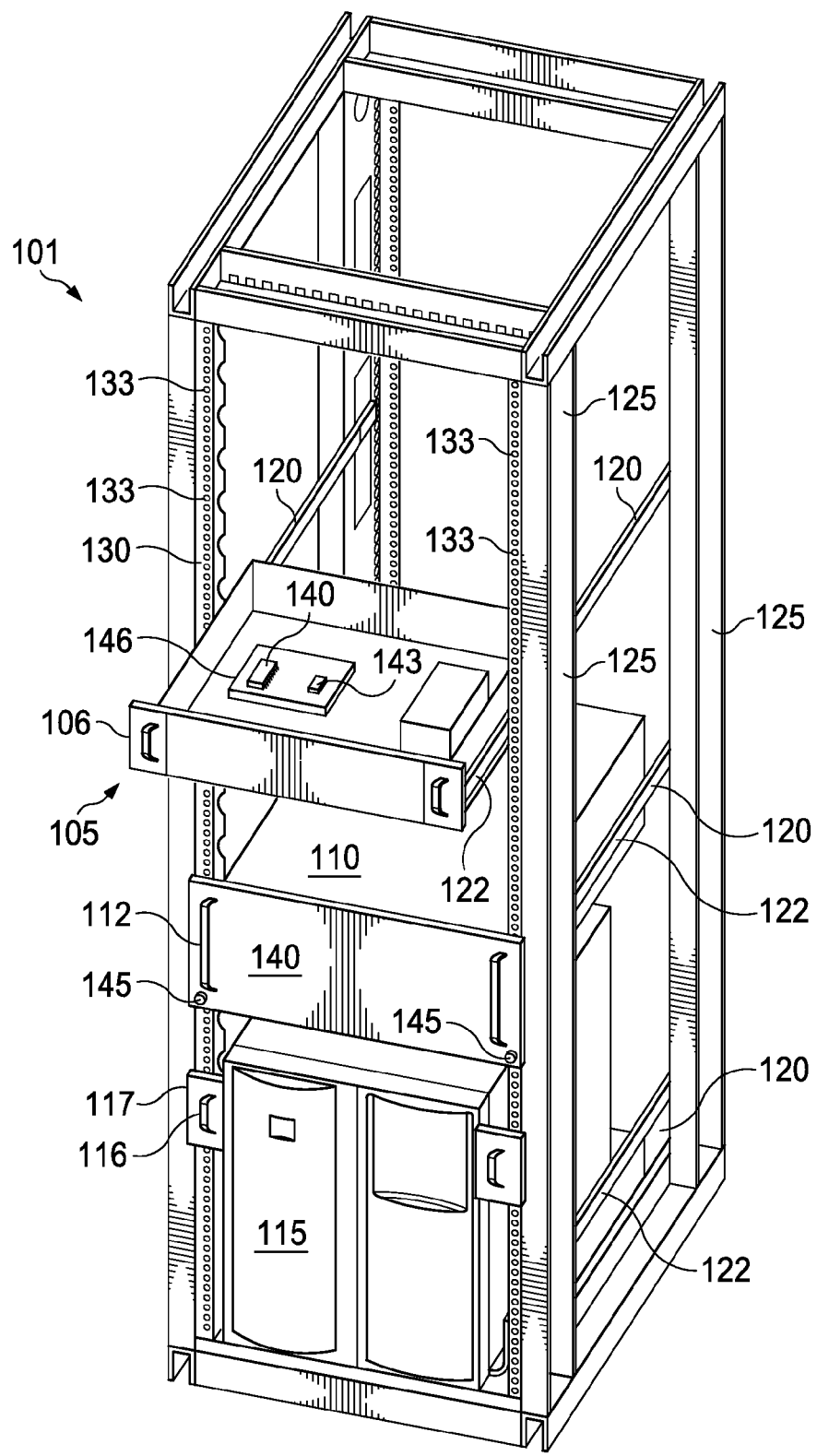
FIG. 1 shows a perspective view of an example of a rack according to some embodiments.

FIG. 1 shows a perspective view of a rack that includes various chassis for housing and supporting electronic equipment such as computer systems. In the embodiment shown, the rack and chassis conform to the EIA standard. Rack 101 includes vertical side rails 125 that provide vertical support to the rack. Attached to vertical rails 125 are vertical members 130 that include square perforations 133 used for securing the chassis to rack 101. Chassis 105, 110, and 115 support electronic equipment such as computer systems in the rack. These chassis may fully enclose the electronics equipment, such as chassis 115 and 110, or partially enclose electronics equipment, such as chassis 105. These chassis are mounted in the electronics rack 101 by chassis rails 122 attached to the chassis and rack rails 120 attached to the rack.

Sliding rails 120 and 122 allow a chassis to be inserted into rack 101 and slide into a secured position in the rack such as the positions shown for chassis 110 and 115. Chassis 105, 110, and 115 each have handles 106, 112, and 116, respectively, attached directly to the chassis or fixably coupled to the chassis via a device such as a rack wing 117. The handles allow a user to move the chassis in and out on the sliding rails 120 and 122. Handles 112 are attached to the front panel 140 of chassis 110. Handles 116 are attached to rack wings 117 which are attached to chassis 115. FIG. 1 shows the handles 106, 112, and 116 attached in a vertical orientation. In other embodiments, the handles may be attached in other orientations such as in a horizontal orientation.

The electronics equipment supported by chassis 105 includes a computer system that has processor 140 and memory 143 electrically coupled to the processor on printed circuit board (PCB) 146. Electronics rack 101 may include a variety of electronics equipment including different types of computer systems or it may house a single computer system.

Figure 2:
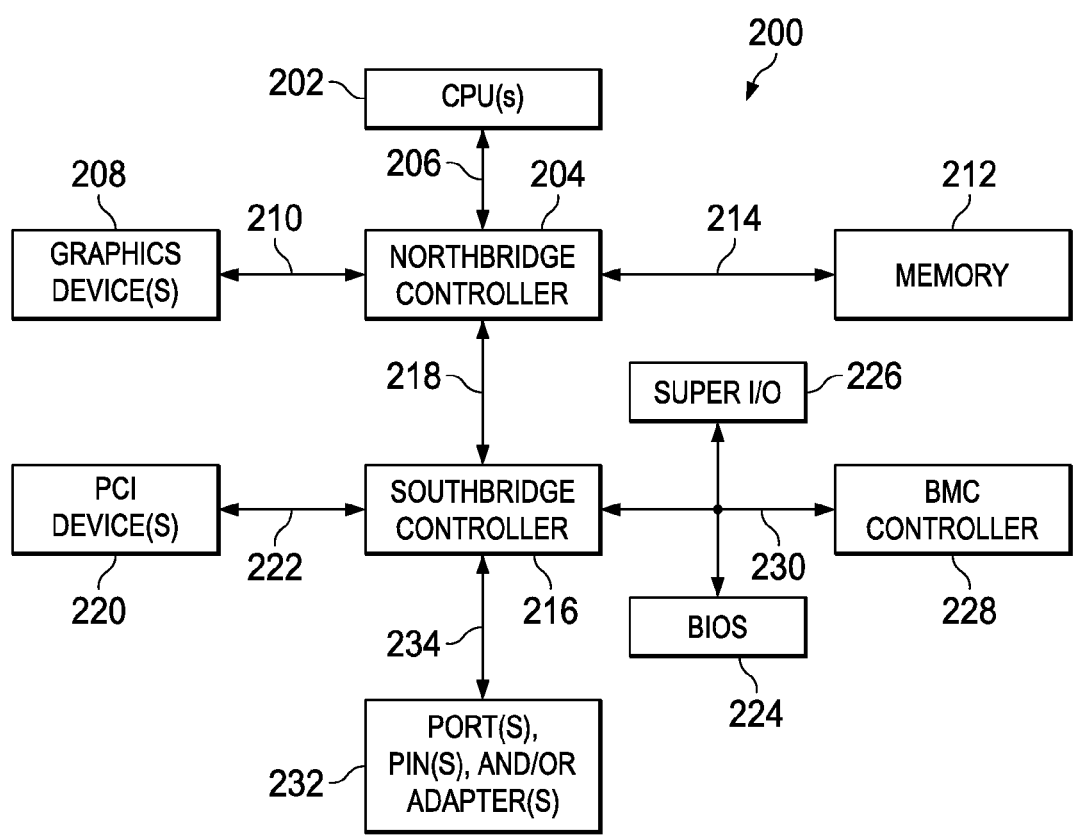
FIG. 2 is a block diagram of an example of an Information Handling System (IHS) according to some embodiments.
Figure 3A:
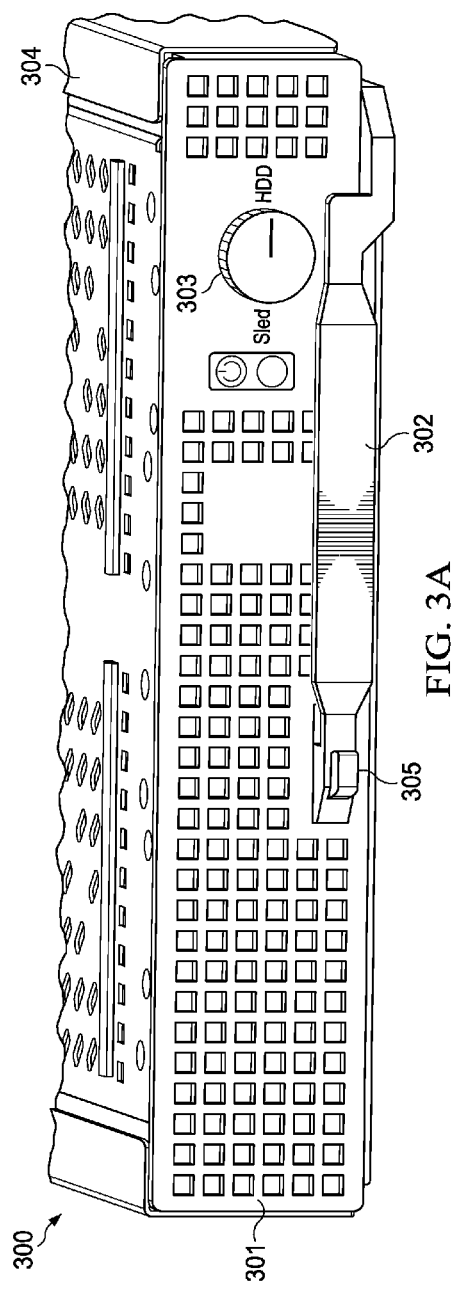
FIGS. 3A-C are diagrams of an example of a chassis with a multi-function handle in a first configuration according to some embodiments.
Figure 3B:
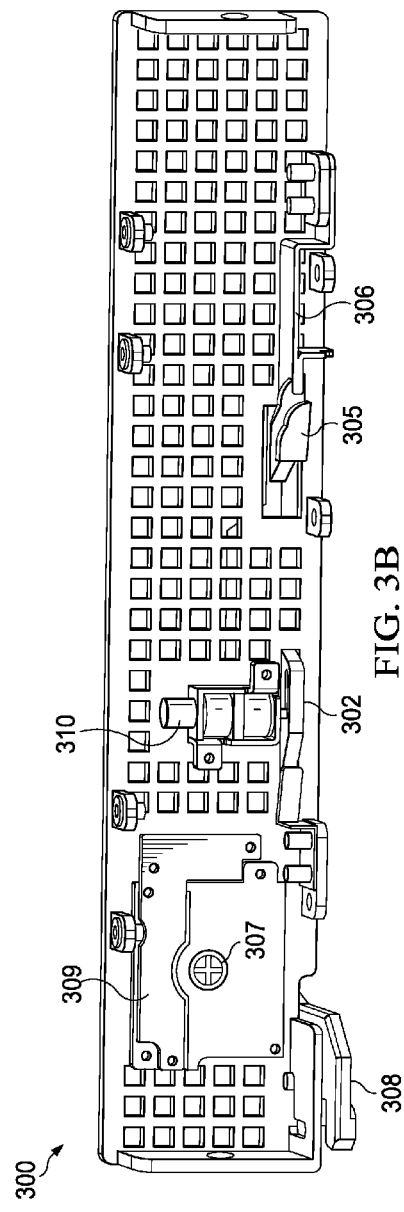
Figure 3C:
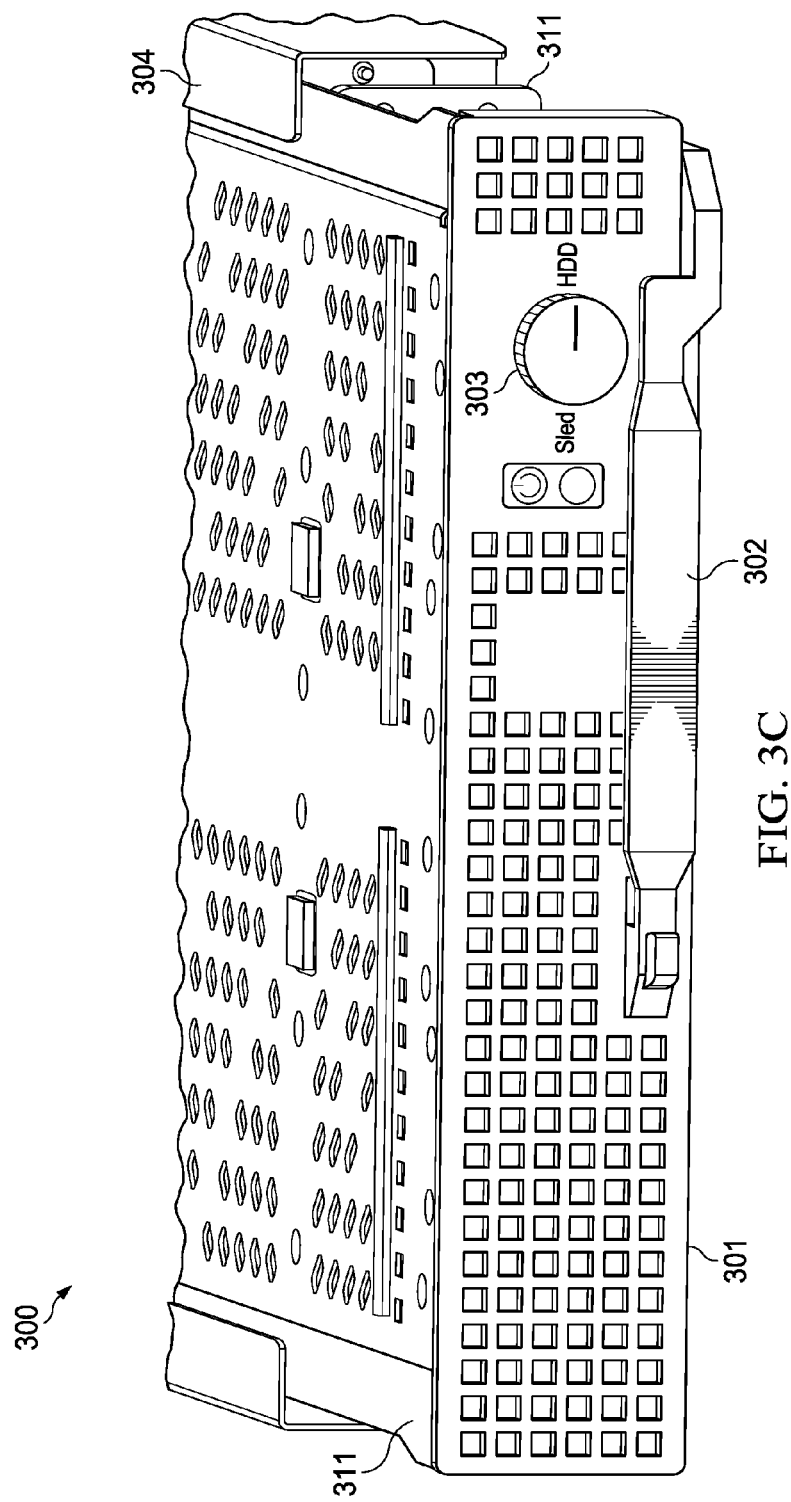

FIG. 2 is a block diagram IHS 200 which may be used to implement any computer system or device within chassis 105, for example. As shown, IHS 200 includes one or more CPUs 202. In various embodiments, IHS 200 may be a single-processor system including one CPU 202, or a multi-processor system including two or more CPUs 202 (e.g., two, four, eight, or any other suitable number). CPU(s) 202 may include any processor capable of executing program instructions. For example, in various embodiments, CPU(s) 202 may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of CPU(s) 202 may commonly, but not necessarily, implement the same ISA. In an embodiment, a motherboard (not shown) may be configured to provide structural support, power, and electrical connectivity between the various components illustrated in FIG. 3.

CPU(s) 202 are coupled to northbridge controller or chipset 204 via front-side bus 206. Northbridge controller 204 may be configured to coordinate I/O traffic between CPU(s) 202 and other components. For example, in this particular implementation, northbridge controller 204 is coupled to graphics device(s) 208 (e.g., one or more video cards or adaptors, etc.) via graphics bus 210 (e.g., an Accelerated Graphics Port or AGP bus, a Peripheral Component Interconnect or PCI bus, etc.). Northbridge controller 204 is also coupled to system memory 212 via memory bus 214. Memory 212 may be configured to store program instructions and/or data accessible by CPU(s) 202. In various embodiments, memory 212 may be implemented using any suitable memory technology, such as static RAM (SRAM), synchronous dynamic RAM (SDRAM), nonvolatile/Flash-type memory, or any other type of memory.

Northbridge controller 204 is coupled to southbridge controller or chipset 216 via internal bus 218. Generally, southbridge controller 216 may be configured to handle various of IHS 200's I/O operations, and it may provide interfaces such as, for instance, Universal Serial Bus (USB), audio, serial, parallel, Ethernet, etc., via port(s), pin(s), and/or adapter(s) 232 over bus 234. For example, southbridge controller 216 may be configured to allow data to be exchanged between IHS 200 and other devices, such as other IHSs attached to a network. In various embodiments, southbridge controller 216 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 216 may also enable connection to one or more keyboards, keypads, touch screens, scanning devices, voice or optical recognition devices, or any other devices suitable for entering or retrieving data. Multiple I/O devices may be present in IHS 200. In some embodiments, I/O devices may be separate from IHS 200 and may interact with IHS 200 through a wired or wireless connection. As shown, southbridge controller 216 is further coupled to one or more PCI devices 220 (e.g., modems, network cards, sound cards, video cards, etc.) via PCI bus 222. Southbridge controller 216 is also coupled to Basic I/O System (BIOS) 224, Super I/O Controller 226, and Baseboard Management Controller (BMC) 228 via Low Pin Count (LPC) bus 220.

BIOS 224 includes non-volatile memory having program instructions stored thereon. Those instructions may be usable CPU(s) 202 to initialize and test other hardware components and/or to load an Operating System (OS) onto IHS 200. As such, BIOS 224 may include a firmware interface that allows CPU(s) 202 to load and execute certain firmware, as described in more detail below. In some cases, such firmware may include program code that is compatible with the Unified Extensible Firmware Interface (UEFI) specification, although other types of firmware may be used.

BMC controller 228 may include non-volatile memory having program instructions stored thereon that are usable by CPU(s) 202 to enable remote management of IHS 200. For example, BMC controller 228 may enable a user to discover, configure, and manage BMC controller 228, setup configuration options, resolve and administer hardware or software problems, etc. Additionally or alternatively, BMC controller 228 may include one or more firmware volumes, each volume having one or more firmware files used by the BIOS' firmware interface to initialize and test components of IHS 200.

Super I/O Controller 226 combines interfaces for a variety of lower bandwidth or low data rate devices. Those devices may include, for example, floppy disks, parallel ports, keyboard and mouse, temperature sensor and fan speed monitoring, etc.

In some cases, IHS 200 may be configured to access different types of computer-accessible media separate from memory 212. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 200 via northbridge controller 204 and/or southbridge controller 216.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that rack 101 and IHS 200 are merely illustrative and are not intended to limit the scope of the disclosure described herein. In particular, any rack, computer system, and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

A person of ordinary skill in the art will also recognize in light of this disclosure that rack 101 of FIG. 1 and IHS 200 of FIG. 2 are examples of devices and components with which present embodiments may be utilized. However, these embodiments are in no way limited for use only with rack 101 or IHS 200.

FIGS. 3A-C and 4A-C are diagrams of an example of a chassis with a multi-function handle. In various embodiments, chassis 300 may include a one-handle-with-knob design to fulfill both chassis and drawer access requirements. Particularly, chassis 300 may include sled 304 and drawer 311. Sled 304 is configured to be installed in rack 101, and drawer 311 is configured to slide in and out of sled 304. Chassis 300 also includes front panel 301 comprising handle 302 and selector 303.

Selector 303, in this example illustrated as a knob, enables a user to set handle 302 into one of two configurations: (i) a first configuration (labeled "HDD") where handle 302 is fixed and allows a user to pull or slide drawer 311 without also pulling sled 304 outward from rack 101, or (ii) a second configuration (labeled "sled") where handle 302 acts as a lever that allows the user to pull or slide the entire chassis 300 comprising sled 304 and drawer 311 outward from rack 101. In the second configuration, wrench portion 308 of handle 302 also engages with vertical side rail 125 of rack 101 provide a connector matting force to facilitate disconnecting one or more electrical connectors between the sled and a backplane of rack 101 (not shown).

In various embodiments, drawer 311 may include a plurality of Hard Disk Drives (HDDs) bays, and each of the plurality of HDD bays may be configured to receive a respective HDD connected to it in a direction perpendicular to the direction in which drawer 311 slides in and out of sled 304. PCB 309 may include circuitry and/or displays that indicate the status of chassis 300 (e.g., power on) and/or its components.

Knob or selector assembly 303 is coupled to handle 302 via rotating cam mechanism 307. In operation, when selector 303 is set in a first position ("HDD"), handle 302 is disposed at a first location alongside front panel 301 so that wrench portion 308 does not engage with rail 201; that is, farther away from side rail 125. Touch point 305 grabs drawer pin(s) 306, and therefore handle 302 becomes fixedly coupled to drawer 311. When pulled in this configuration, drawer 311 opens or slides out with respect to sled 304 and provides access to its HDDs without disconnecting or powering them off.

Figure 4C:
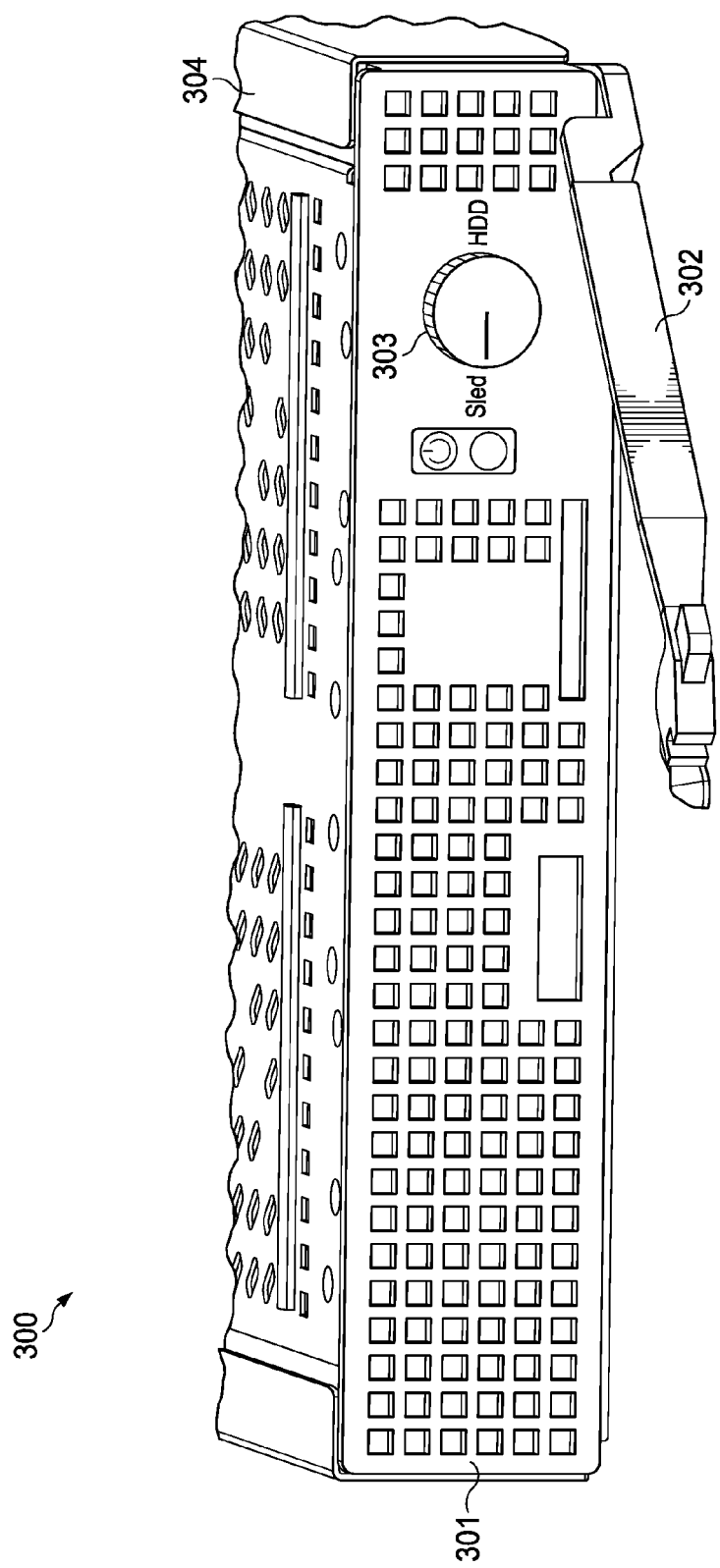

In various implementations, the user's turning of knob 303 between the first and second positions moves handle 302 from side to side between the first and second configurations. As such, and as shown in FIGS. 4A and 4B, when selector 303 is set in the second position ("sled"), handle 302 is disposed at a second location alongside front panel 301, closer to side rail 125. Touch point 305 grabs a portion of front panel 301 such that it imparts upon handle 302 a lever or swivel characteristics that provides the aforementioned connector matting force. An extended handle 302 is shown in FIG. 4C. In this configuration, the entire chassis 300 can be removed from rack 101.

In some embodiments, PCB 309 (or another internal chassis component) may include an electronic circuit (not shown) and lock 310 coupled to the electronic circuit and to handle 302. The electronic circuit may be configured to determine that the sled is powered on, and in response it may activate a solenoid of lock 310, which in turns activates a pin and prevents entire chassis 300 from being inadvertently removed from rack 101.

In various embodiments, the systems and method described herein may implement a dual-function handle in the limited space that a typical chassis provides. Particularly, a one-handle-with-knob mechanism covers both lever and drawer handle functions. The knob is used to switch the handle between the functions of sled removal and drawer release, and it also indicates the status of the handle while providing direct visual guidance to the users. Moreover, the connector matting force aspect of lever mechanism solves plugging problem(s) in higher density server designs.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A chassis, comprising:
   a sled installed in a rack;
   a drawer that slides in and out of the sled; and
   a front panel of the chassis comprising a handle and a selector, wherein the selector enables a user to selectively pull, from the rack using the handle, one of: (i) the drawer without the sled, or (ii) the sled and the drawer together, wherein the selector is a round knob, wherein the round knob is coupled to the handle, and wherein the round knob, rotated to a first position, enables the user to pull the drawer outward from the rack without pulling the sled, and wherein round knob, rotated to a second position, enables the user to pull both the sled and the drawer outward from the rack simultaneously.

2. The chassis of claim 1, wherein the handle is disposed at a first location alongside the front panel when the round knob is in the first position, and wherein the handle is disposed at a second location alongside the front panel when the round knob is in the second position.

3. The chassis of claim 2, wherein the second location is closer to a lateral edge of the front panel than the first location.

4. The chassis of claim 3, wherein when the round knob is in the first position, the handle operates as a fixed handle to allow the drawer to be pulled outward from the rack without disconnecting an electronic connector between the sled and a backplane of the rack.

5. The chassis of claim 4, wherein when the round knob is in the second position, the handle engages with the rack and to operate as a lever to allow the sled and the drawer to be pulled from the rack and to facilitate disconnection of the electronic connector between the sled and the backplane of the rack.

6. The chassis of claim 5, further comprising:
   an electronic circuit that determines that the sled is powered-on; and
   a lock coupled to the electronic circuit and to the handle, wherein the lock prevents the sled from being removed outward from the rack in response to the determination, and despite the round knob being in the second position.

7. A system, comprising:
   a rack; and
   a chassis coupled to the rack, the chassis comprising:
      a sled;
      a drawer configured to slide in and out of the sled; and
      a front panel of the chassis comprising a handle and a selector, wherein the selector enables a user operating the handle to selectively remove from the rack, either: (i) the drawer alone, or (ii) the entire chassis, wherein the selector has a first position corresponding to the removal of the drawer alone, and a second position corresponding to the removal of the entire chassis.

8. The system of claim 7, wherein the handle is disposed at a first location alongside the front panel when the selector is in the first position, wherein the handle is disposed at a second location alongside the front panel when the selector is in the second position, and wherein the second location is closer to a lateral edge of the front panel than the first location.

9. The system of claim 8, wherein when the selector is in the first position, the handle operates as a fixed handle to enable the drawer without the sled to be removed from the rack without disconnecting an electric connection between the sled and a backplane of the rack.

10. The system of claim 9, wherein when the selector is in the second position, the handle engages with the rack and to operate as a lever to enable the chassis to be removed from the rack and to disconnect the electric connection between the sled and the backplane of the rack.

11. A method, comprising:
    accessing a chassis installed in a rack, the chassis comprising:
       (i) a sled coupled to the rack; and
       (ii) a drawer that slides in and out of the sled, the drawer having a front panel, the front panel having a handle and a selector;
    setting the selector to a first position;
    pulling the handle to slide the drawer outward from the rack while the sled remains coupled to the rack;
    setting the selector to the second position; and
    pulling the handle to slide the entire chassis outward from the rack.

12. The method of claim 11, wherein, when the selector is in the first position, the pulling of the handle does not disconnect an electric connector between the chassis and the rack.

13. The method of claim 11, wherein when the selector is in the second position, the pulling of the handle disconnects the electric connector between the chassis and the rack.

* * * * *